(12) United States Patent
Bastek et al.

(10) Patent No.: US 6,409,829 B1
(45) Date of Patent: Jun. 25, 2002

(54) MANUFACTURE OF DIELECTRICALLY ISOLATED INTEGRATED CIRCUITS

(75) Inventors: John Joseph Bastek, Reading; Thomas J. Krutsick, Fleetwood; Robert D. Plummer, Robesonia, all of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/461,609

(22) Filed: Dec. 15, 1999

(51) Int. Cl.$^7$ .................................................. C30B 23/00

(52) U.S. Cl. .......................................... 117/95; 438/489

(58) Field of Search ................................. 438/341, 206, 438/212, 222, 199, 203, 489; 257/512, 195, 194; 148/33; 117/95–96; 29/25.01

(56) References Cited

U.S. PATENT DOCUMENTS 5,773,350 A * 6/1998 Herbert et al. .............. 438/364

* cited by examiner

Primary Examiner—Douglas Wille
Assistant Examiner—DiLinh P. Nguyen
(74) Attorney, Agent, or Firm—Peter V. D. Wilde; Thomas, Kayden, Horstemeyer & Risley LLP

(57) ABSTRACT

Integrated circuit devices are formed in a substrate wafer using selective epitaxial growth (SEG). Non-uniform epitaxial wafer thickness results when the distribution of SEG regions across the surface of the wafer is non-uniform, resulting in loading effects during the growth process. Loading effects are minimized according to the invention by adding passive SEG regions thereby giving a relatively even distribution of SEG growth regions on the wafer. The passive regions remain unprocessed in the finished IC device.

4 Claims, 4 Drawing Sheets

MANUFACTURE OF DIELECTRICALLY ISOLATED INTEGRATED CIRCUITS

FIELD OF THE INVENTION

This invention relates to processes for making dielectrically isolated complementary bipolar devices and/or complementary MOS devices using selective epitaxial growth (SEG) techniques.

BACKGROUND OF THE INVENTION

Bipolar and MOS devices in state of the art circuits are used in complementary pairs, and, in high voltage circuits, are typically combined with complementary high voltage DMOS devices in the same IC. It is important that these device species be isolated, and the fabrication sequence for the different types of devices be compatible. Various isolation techniques have been used as complementary bipolar technology has evolved. LOCOS processes were used for many years but encountered severe leakage problems as device dimensions shrunk. Trench isolation techniques with upside down wafer preparation are widely used but are cumbersome and expensive by current silicon processing standards. A more recent approach uses selective epitaxial growth (SEG) to form oxide isolated silicon device tubs in a sea of field oxide. A thick oxide is grown, or grown and deposited, on a silicon substrate, and openings are formed in the oxide to the silicon substrate. Epitaxial silicon is grown in the openings to form oxide isolated tubs of single crystal silicon. Close spacing of the isolated SEG tubs eliminates the waste area characteristic of the LOCOS bird's beak, and can provide reduced surface area as compared with the area required for the etched grooves in trench isolation. Consequently, SEG isolation processes allow for higher packing density. They also result in lower device leakage and lower device cost.

SEG isolation is particularly well suited for vertically oriented devices. One of the designs of choice for bipolar devices is a buried collector structure with vertical current flow. Vertical DMOS devices are also desirable from the standpoint of reducing device area on the chip.

In integrated circuits using these device types, a large number of device sites, or SEG isolated regions, are produced on a single wafer. Depending on the IC layout, the size of the SEG regions varies, as well as the spacing between them. It has been found that on SEG wafers, the epi layer thickness shows unacceptable variations between SEG regions across the wafer. The regions showing non-uniformity are both within chip sites and across the wafer, i.e. between chip sites. This is due to "loading" effects in the thermodynamics of epitaxial growth.

STATEMENT OF THE INVENTION

We have developed a process for making SEG isolated devices which largely eliminates the non-uniformity in thickness between SEG regions. The process is cost effective and fully compatible with standard processing for making, e.g., vertical complementary bipolar devices with buried collectors. The process is also compatible with making complementary IGBT devices and standard CMOS devices in the same chip. The process eliminates undesirable loading factors through the use of a sea of passive SEG islands surrounding the device sites. This produces uniform growth conditions and uniform growth over the entire wafer, while still retaining isolation between device sites.

DETAILED DESCRIPTION

Figure 1:
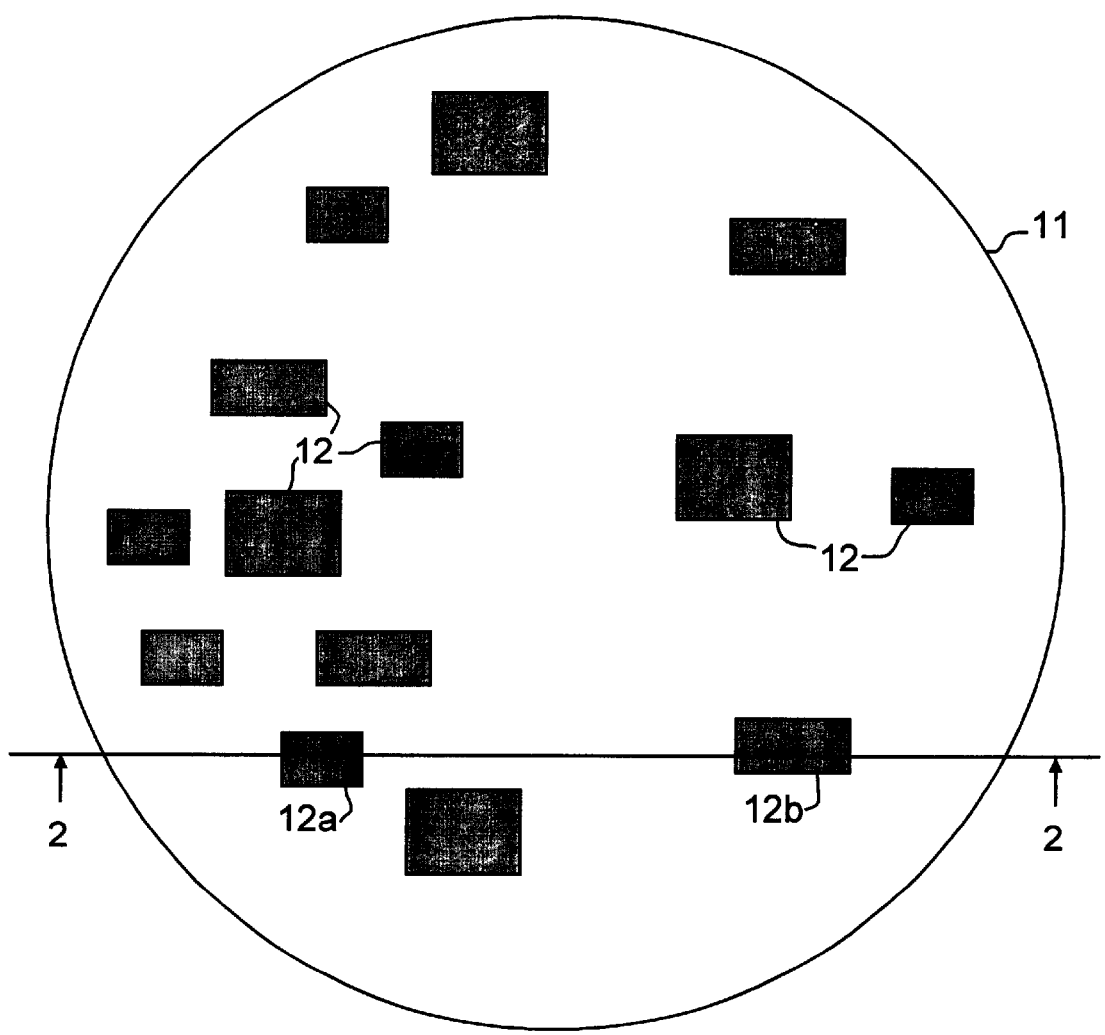
FIG. 1 is a schematic illustration of a conventional SEG wafer illustrating a disparate distribution of SEG sites on the wafer.

Referring to FIG. 1, a semiconductor wafer 11 is shown with sites 12 where selective epitaxial growth (SEG) is performed. This illustration is highly stylized to show the inventive concept. The typical wafer will have many more such sites of relatively smaller dimensions, and will have an orderly array of chip sites arranged in rows on the wafer. The chip sites are usually identical and may constitute two or more SEG regions that exhibit the non-uniform thickness problem. The arrangement in FIG. 1 more suitably shows the problem of non-uniform SEG layers across the wafer. Both are problems that are addressed by the invention. The disparate concentration of SEG sites in either case will be qualitatively similar to that represented in FIG. 1.

Figure 2:
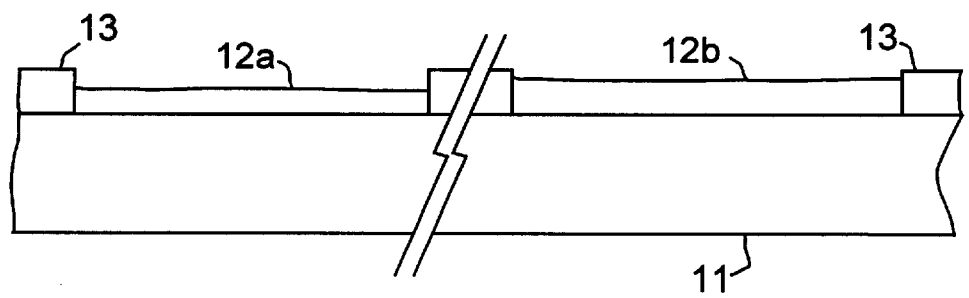
FIG. 2 is a section view through 2—2 of FIG. 1 showing the effect of loading on the SEG device region thickness.

The effect of disparate grouping of SEG sites along the wafer surface is shown in FIG. 2. FIG. 2 is a section along section line 2—2 of FIG. 1 showing the relevant portions of the wafer where sites 12a and 12b are located. The field oxide 13 is shown in this view around the perimeter of the SEG sites. As is evident from this figure the two sites 12a and 12b have different epitaxial thickness as a result of the known loading effect on the growth process. Due to the close proximity of several other growth sites, the localized region above SEG site 12a becomes relatively depleted of precursor gases as the process proceeds compared with the concentration of precursor gas over site 12b. This causes a thickness variation in the epitaxial layers between the two sites.

Figure 3:
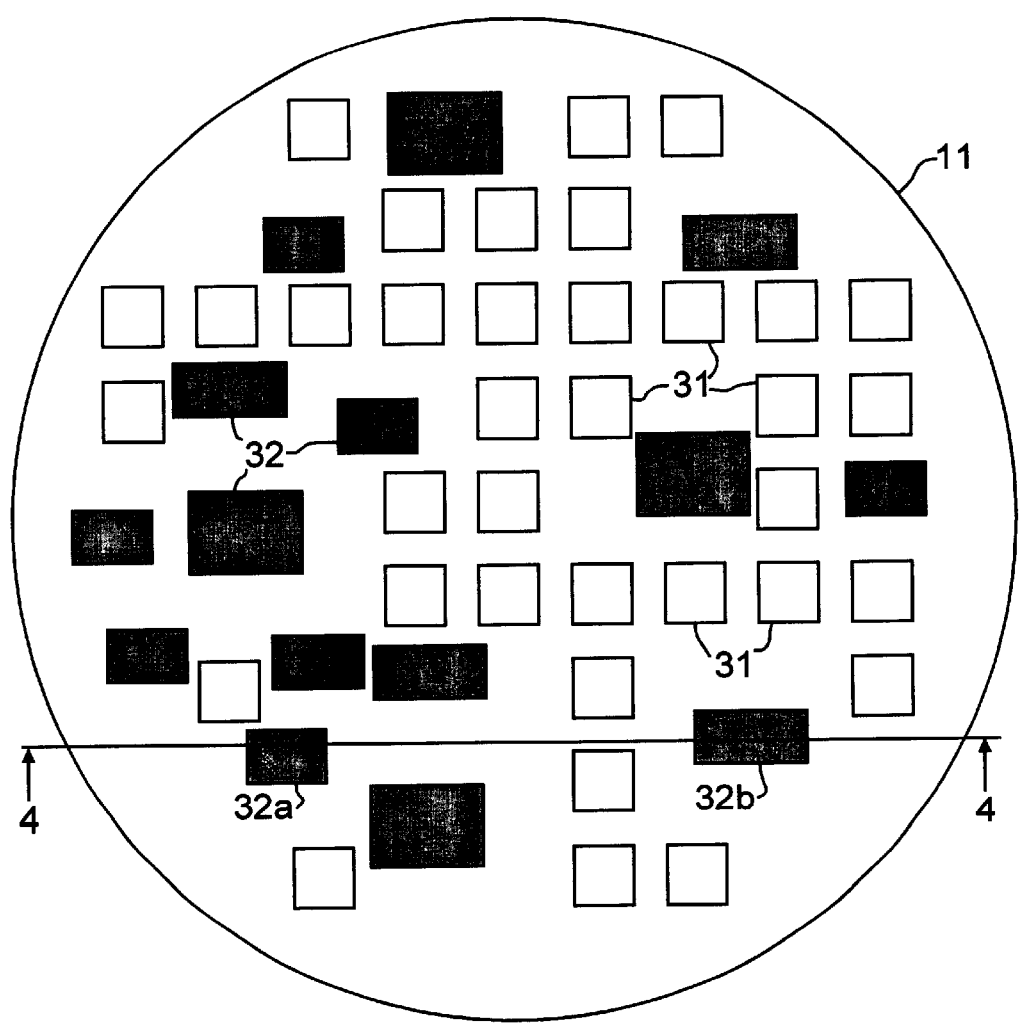
FIG. 3 is schematic illustration of a SEG wafer using the sea of SEG islands according to the invention.
Figure 4:
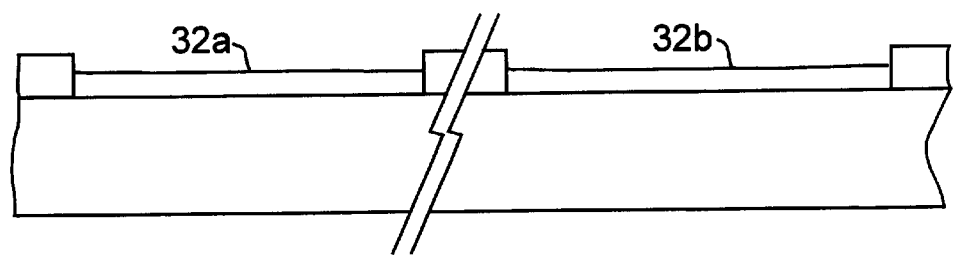
FIG. 4 is a section through 4—4 of FIG. 3 illustrating the effect on the SEG device region thickness of using the sea of SEG islands according to the invention.

To counteract this depletion or loading effect, the wafer is provided with a sea of passive SEG sites as shown in FIG. 3. Passive sites, designated 31 in FIG. 3, are defined as regions where epitaxial layers are grown, but where no devices are located, i.e. regions devoid of electrical devices. The active SEG regions are shown at 32 and are distributed unevenly as in FIG. 1. The objective is to create a relatively even distribution of growth sites over the surface of the wafer. The effect of the passive sites, and the relatively even growth site distribution, is to cause the precursor materials to distribute evenly over the wafer surface thereby reducing the loading effect and creating epitaxial layers of approximately equal thickness in each of the active SEG regions.

As indicated above the active device regions are exaggerated in size for clarity. The passive regions in the figure are also shown as large areas. They are also shown as having a single area and shape. Both of these conditions can interfere with effective or optimum layout of the active circuits on the wafer. Consequently, the size of the passive regions can be made relatively small, and the shape and placement of these regions can be varied so that they have negligible or no impact on the design layout. As suggested by FIG. 3, it will usually be preferred that the passive sites be smaller in area than the active sites.

FIGS. 5–10 are schematic representations of process steps used for preparing SEG wafers with uniform growth regions for device manufacture. Two growth sites are illustrated, the site on the left hand site of the figures is an active site, and the site on the right hand side of the figures is a passive site. For illustration, the active site will contain an n-p-n vertical transistor. However, it will be understood that a variety of devices, including complementary pairs of bipolar and MOS transistors, may be formed on a single wafer. The bipolar transistors may be vertically or horizontally oriented, as known in the art. The MOS devices may be high voltage devices, or conventional MOS devices used for standard logic or memory. Other devices such as insulated gate bipolar (IGBT) devices may also be integrated in the wafers described here.

Figure 5:
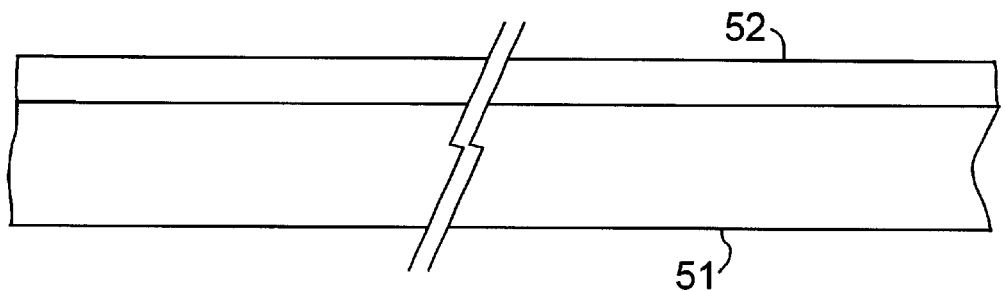
FIGS. 5–10 are schematic representations of process steps useful for producing the wafer of the invention.
Figure 6:
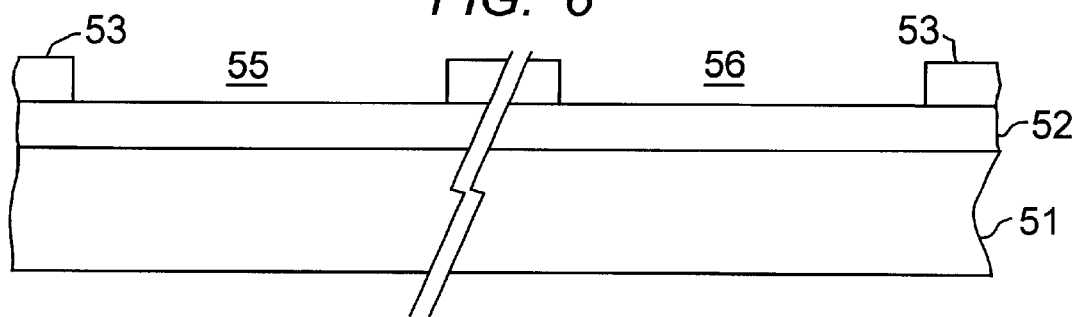
Figure 7:
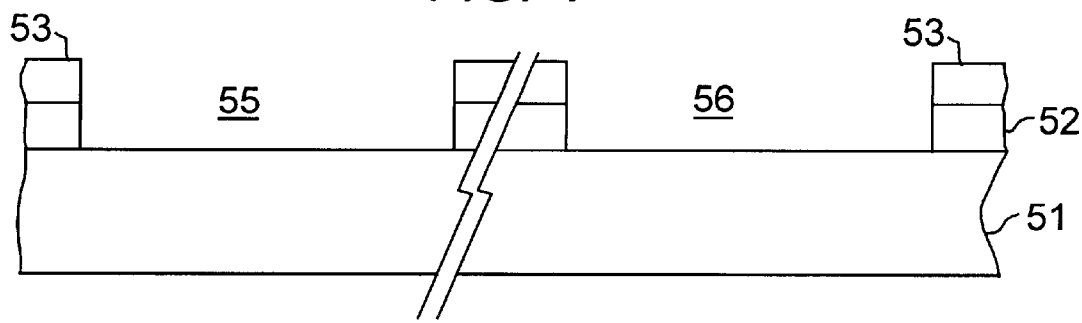

Referring to FIG. 5, wafer 51 is a p-type wafer, preferably with (100) orientation and resistivity greater than 10 ohm cm. The wafer is thermally oxidized in a conventional manner, e.g. furnace heating at 1000° C. in oxygen, to grow layer 52. Layer 52 may be approximately 0.5–2.0 microns in thickness. A photoresist mask layer 53 is applied and patterned by conventional lithography to form openings, as shown in FIG. 6, over the active region 55 and the passive region 56. The lithography used will normally be photolithography but other lithographic techniques such as e-beam or x-ray lithography may be substituted. The oxide layer 52 is then patterned by standard etching, e.g. plasma or RIE etching, to produce the structure shown in FIG. 7, with openings down to substrate 51.

Figure 8:
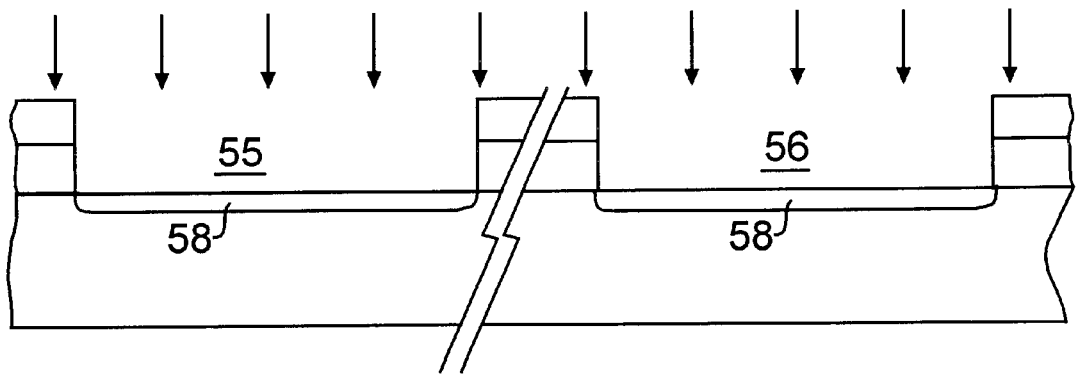

Using patterned photoresist 53 as a mask, or alternatively, stripping the photoresist and using patterned oxide layer 52 as a mask, the exposed substrate regions at 55 and 56 are implanted as shown in FIG. 8, to form the buried n+ collector region 58. The passive site 56 may masked against this implant but is preferably processed in the same way as site 55 so as to not add any process steps or process complexity in implementing the invention. The implanted regions 58 may be formed using arsenic at 100 keV, with a dose in the range $5\times10^{14}$ to $5\times10^{15}$ atoms per $cm^2$.

The photoresist mask, if present at this stage, is stripped. The implanted substrate may be annealed at this point, e.g. 1000° C. in nitrogen for 1 hour, to activate the implant and remove implant damage. Conventional chan stops or guard rings (not shown), normally used for isolation around the device regions, may be formed at this point by suitable masking and boron implants.

Figure 9:
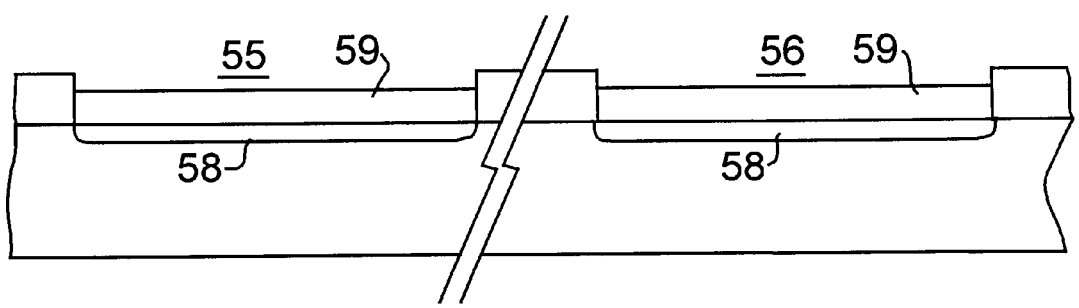

With reference to FIG. 9, epitaxial silicon is then selectively deposited in windows 55 and 56 to form SEG layers 59 over the buried n+ layers. A typical SEG deposition sequence is:

1. hydrogen bake at 1000° C. at 25 torr for 5 min.
2. SEG deposition at 650–950° C. and 1–50 torr using a precursor gas of dichlorosilane in a hydrogen carrier gas. Other precursor materials, such as silane and HCl, or trichlorosilane and hydrogen may be used. SEG growth techniques are well known.

Due to the uniform distribution of growth regions over the wafer, as described earlier, the SEG layers in the active regions, represented by region 55, and the SEG layers in the passive regions, represented by region 56, are uniform in thickness.

With reference to FIG. 9, the two epi regions 59 are shown as comprising a single epitaxial deposit, i.e., the layers are formed in the same epitaxial deposition operation. Alternatively, the epitaxial layers in these two regions can be formed using different depositions so as to result in different epitaxial materials at the two locations. Implicit is the presence of a plurality of regions of each composition, thus presenting the same problem/solution context described earlier.

Figure 10:
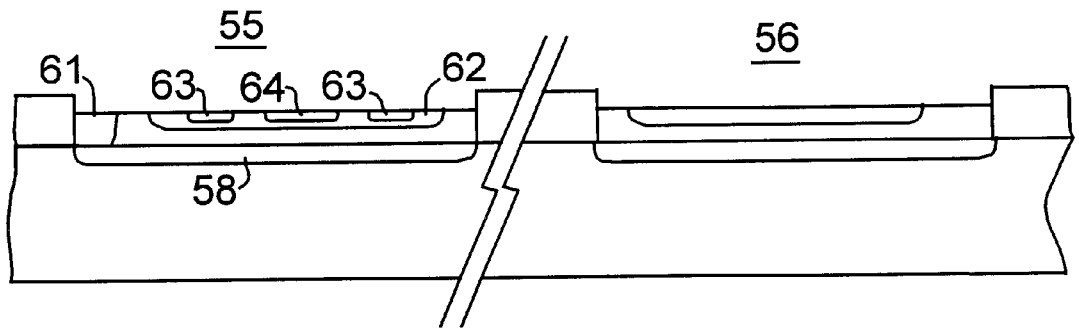

The SEG active regions are then processed by conventional processing to form the desired active devices. An example of a vertical bipolar n-p-n device is shown in FIG. 10, where n+ contact 61 is shown contacting the buried collector 58. An oxide layer is grown or deposited over the SEG regions and standard masking and implantation are used to form the buried collector contact, and the base and emitter elements. P-type base layer 62 and P-contact regions 63 are formed by conventional masking and boron implant. The n-type emitter region 64 is implanted using an arsenic implant. The region 56 is shown devoid of these active device features because the first oxide layer formed over all the SEG regions is not patterned but left intact over the passive regions. The n+ contact region 61 that extends to the buried n+ collector region 58 is shown to one side of SEG layer. It may be formed along a portion of the perimeter of the layer, as shown, or may extend around the whole layer. Suitable electrical contacts (not shown) are then made to the structure shown in FIG. 10 to complete the active device, and the device is then packaged in a conventional device package.

Various additional modifications of this invention will occur to those skilled in the art. All deviations from the specific teachings of this specification that basically rely on the principles and their equivalents through which the art has been advanced are properly considered within the scope of the invention as described and claimed.

What is claimed is:

1. A method for the manufacture of integrated circuit devices comprising the steps of:
   (a) forming an insulating layer on a semiconductor substrate,
   (b) etching a plurality of openings in the insulator layer extending through the insulating layer and exposing the semiconductor substrate, the plurality of openings comprising passive sites and active device sites, the active device sites being distributed relatively unevenly across the silicon wafer, and the combination of the active device sites and the passive sites having a relatively even distribution across the substrate,
   (c) implanting impurities into at least the active device sites,
   (d) growing a plurality of semiconductor epitaxial layers in each of the openings, and
   (e) forming semiconductor devices in the active device sites leaving the passive sites devoid of devices.

2. The method of claim 1 wherein the semiconductor is silicon.

3. A method for the manufacture of a silicon bipolar transistor comprising the steps of:
   (a) forming an oxide layer on a silicon substrate,
   (b) forming a plurality of windows in the oxide layer, the plurality of windows comprising passive sites and active device sites, the active device sites being distributed relatively unevenly across the silicon wafer, and the combination of the active device sites and the passive sites having a relatively even distribution across the substrate,
   (c) implanting impurities into at least the active device sites to form buried impurity layers,
   (d) selectively growing epitaxial layers in each of the plurality of windows,
   (e) masking the passive sites leaving the active device sites unmasked,
   (f) processing the active device sites to form bipolar transistors leaving the passive sites devoid of active devices.

4. A method for the manufacture of integrated circuit devices comprising the steps of:
   (a) forming an SiO$_2$ layer on a silicon substrate,
   (b) etching a plurality of openings in the SiO$_2$ layer extending through the SiO$_2$ layer and exposing said silicon substrate, the plurality of openings comprising passive sites and active device sites, the active device sites being distributed relatively unevenly across the silicon wafer, and the combination of the active device sites and the passive sites having a relatively even distribution across the substrate,
   (c) implanting impurities into at least the active device sites,
   (d) growing an epitaxial layer in each of the plurality of openings,
   (e) masking the passive sites leaving the active device sites unmasked,
   (f) forming active silicon devices in the active device sites leaving the passive sites devoid of active silicon devices.

* * * * *